United States Patent
Wong et al.

(10) Patent No.: US 9,665,135 B2
(45) Date of Patent: May 30, 2017

(54) DEVICE STORAGE CABINET

(71) Applicant: Ergotron, Inc., St. Paul, MN (US)

(72) Inventors: Thiem Wong, Minneapolis, MN (US); David J. Prince, Saint Paul, MN (US); Saeb Asamarai, Columbia Heights, MN (US); Mustafa A. Ergun, Shoreview, MN (US); Robert W. Fluhrer, Prior Lake, MN (US)

(73) Assignee: Ergotron, Inc., St. Paul, MN (US)

( * ) Notice: Subject to any disclaimer, the term of this patent is extended or adjusted under 35 U.S.C. 154(b) by 65 days.

(21) Appl. No.: 14/224,758

(22) Filed: Mar. 25, 2014

(65) Prior Publication Data
US 2015/0253818 A1    Sep. 10, 2015

Related U.S. Application Data

(60) Provisional application No. 61/949,737, filed on Mar. 7, 2014.

(51) Int. Cl.
| | |
|---|---|
| *H02J 7/00* | (2006.01) |
| *G06F 1/16* | (2006.01) |
| *G06F 1/18* | (2006.01) |
| *H05K 5/02* | (2006.01) |
| *A47B 88/60* | (2017.01) |

(52) U.S. Cl.
CPC ............ *G06F 1/182* (2013.01); *G06F 1/1632* (2013.01); *G06F 1/1698* (2013.01); *G06F 1/189* (2013.01); *H02J 7/0027* (2013.01); *H02J 7/0042* (2013.01); *H05K 5/0247* (2013.01); *A47B 88/60* (2017.01)

(58) Field of Classification Search
CPC ...... G06F 1/1632; G06F 1/1637; G06F 1/182; G06F 1/189; G06F 1/1698; B62B 2202/56; H02J 7/0044; H02J 7/0042; H02J 7/0027; H05K 5/0247; A47B 88/60
USPC ................................ 312/223.2, 328, 334.15
See application file for complete search history.

(56) References Cited

U.S. PATENT DOCUMENTS

| | | |
|---|---|---|
| 4,892,367 A | 1/1990 | Jantzen |
| 5,458,409 A | 10/1995 | Sheng |

(Continued)

FOREIGN PATENT DOCUMENTS

| | | |
|---|---|---|
| CN | 105210002 A | 12/2015 |
| EP | 1116846 A1 | 7/2001 |

(Continued)

OTHER PUBLICATIONS

"International Application Serial No. PCT/US2014/040295, Invitation to Pay Additional Fees and Partial Search Report mailed Dec. 2, 2014", 5 pgs.

(Continued)

*Primary Examiner* — Adrian S Wilson
*Assistant Examiner* — Abhishek Rathod
(74) *Attorney, Agent, or Firm* — Schwegman Lundberg & Woessner, P.A.

(57) ABSTRACT

In one example, a cabinet is described for storing at least one electronic device. The cabinet includes a frame, a power supply system for charging the at least one device, and a shelving assembly. The shelving assembly can include a stationary member engaged to the frame, and a pivoting member engaged to the stationary member. The pivoting member can be adapted to hold the at least one device.

16 Claims, 11 Drawing Sheets

(56) References Cited

U.S. PATENT DOCUMENTS

| | | | |
|---|---|---|---|
| 5,572,402 A * | 11/1996 | Jeong | G06F 1/184 |
| | | | 361/679.31 |
| 5,755,497 A | 5/1998 | Chang | |
| 5,924,781 A | 7/1999 | Mitchell | |
| 6,227,632 B1 * | 5/2001 | Liu | G06F 1/181 |
| | | | 312/223.2 |
| 6,322,177 B1 | 11/2001 | Vasudeva | |
| 6,445,576 B1 * | 9/2002 | Wooden | G06F 1/187 |
| | | | 312/223.1 |
| 6,951,468 B1 | 10/2005 | Greco | |
| 7,055,833 B2 | 6/2006 | Wixted et al. | |
| 7,160,113 B2 | 1/2007 | McConnell | |
| 7,173,821 B2 | 2/2007 | Coglitore | |
| D547,920 S | 7/2007 | Kinsley et al. | |
| D561,973 S | 2/2008 | Kinsley et al. | |
| 7,325,891 B1 | 2/2008 | Kinsley et al. | |
| 7,437,049 B2 | 10/2008 | Krampotich | |
| 7,690,611 B2 | 4/2010 | Asamarai et al. | |
| 7,712,850 B2 | 5/2010 | Vasudeva | |
| 7,770,986 B1 | 8/2010 | Simaitis | |
| 7,815,267 B1 | 10/2010 | Frousiakis | |
| 7,844,770 B2 | 11/2010 | Petrick et al. | |
| 7,889,494 B2 | 2/2011 | Stampfli | |
| D660,623 S | 5/2012 | Petrick et al. | |
| 8,188,714 B2 | 5/2012 | Petrick et al. | |
| 8,190,806 B2 | 5/2012 | Petrick et al. | |
| D671,703 S | 11/2012 | Guasta et al. | |
| 8,312,199 B2 | 11/2012 | Johnson | |
| D674,620 S | 1/2013 | Petrick et al. | |
| D675,208 S | 1/2013 | Petrick et al. | |
| D675,622 S | 2/2013 | Petrick et al. | |
| 8,503,182 B2 | 8/2013 | Petrick | |
| 8,657,312 B2 | 2/2014 | Guasta et al. | |
| 8,752,848 B2 | 6/2014 | Petrick et al. | |
| 8,935,011 B2 | 1/2015 | Tischer et al. | |
| 9,036,361 B2 * | 5/2015 | Schrock et al. | 361/754 |
| 2003/0111245 A1 | 6/2003 | Haggerty | |
| 2004/0120681 A1 | 6/2004 | Bohle et al. | |
| 2004/0144604 A1 | 7/2004 | Doornbos et al. | |
| 2004/0184243 A1 * | 9/2004 | Mease et al. | 361/725 |
| 2004/0218952 A1 * | 11/2004 | Teo et al. | 399/393 |
| 2008/0055846 A1 | 3/2008 | Clidaras et al. | |
| 2008/0062635 A1 * | 3/2008 | Chang | 361/685 |
| 2008/0106870 A1 | 5/2008 | Dully | |
| 2008/0304224 A1 * | 12/2008 | Della Fiora et al. | 361/683 |
| 2009/0016008 A1 | 1/2009 | Hock | |
| 2009/0157907 A1 | 6/2009 | Chapman | |
| 2010/0079047 A1 | 4/2010 | Koh | |
| 2010/0176700 A1 * | 7/2010 | Perez et al. | 312/334.8 |
| 2010/0176762 A1 | 7/2010 | Daymude et al. | |
| 2011/0062101 A1 | 3/2011 | Todd, Jr. | |
| 2011/0084583 A1 | 4/2011 | Petrick et al. | |
| 2011/0193524 A1 | 8/2011 | Hazzard et al. | |
| 2011/0264927 A1 | 10/2011 | Dearborn et al. | |
| 2011/0266930 A1 | 11/2011 | Petrick et al. | |
| 2011/0267782 A1 | 11/2011 | Petrick et al. | |
| 2011/0309591 A1 | 12/2011 | Petrick et al. | |
| 2012/0198119 A1 | 8/2012 | Johnson | |
| 2013/0051080 A1 | 2/2013 | Van Der Linde et al. | |
| 2013/0073776 A1 | 3/2013 | Johnson | |
| 2013/0175993 A1 * | 7/2013 | Chen | 320/114 |
| 2013/0200584 A1 | 8/2013 | Guasta | |
| 2013/0212987 A1 | 8/2013 | Shigeyama | |
| 2013/0277930 A1 | 10/2013 | Ergun et al. | |
| 2013/0279106 A1 | 10/2013 | Ergun et al. | |
| 2013/0279109 A1 | 10/2013 | Lindblad et al. | |
| 2013/0290592 A1 | 10/2013 | Petrick et al. | |
| 2014/0125271 A1 | 5/2014 | Wang | |
| 2014/0268582 A1 | 9/2014 | Wong et al. | |

FOREIGN PATENT DOCUMENTS

| | | | |
|---|---|---|---|
| EP | 1894784 A2 | 3/2008 | |
| EP | 2380071 A2 | 10/2011 | |
| EP | 2426608 A2 | 3/2012 | |
| EP | 2426608 A3 | 9/2012 | |
| EP | 2583150 A2 | 4/2013 | |
| FR | 2731600 A1 | 9/1996 | |
| GB | 290147 A | 5/1928 | |
| JP | 2000-050974 A | 2/2000 | |
| WO | WO-9216125 A1 | 10/1992 | |
| WO | WO-2010/083455 A2 | 7/2010 | |
| WO | WO-2010/083459 A2 | 7/2010 | |
| WO | WO-2011/112423 A2 | 9/2011 | |
| WO | WO-2013/119264 A1 | 8/2013 | |
| WO | WO-2014160068 A1 | 10/2014 | |
| WO | WO-2015134052 A1 | 9/2015 | |

OTHER PUBLICATIONS

"TOP-TEC TecStore", [online]. © 2013 Dalen Limited. [retrieved on Nov. 24, 2014]. Retrieved from the Internet: <URL:http://www.avpartsmaster.co.uk/GetAttachment.aspx?ProductID=33455>, (Jan. 1, 2013), 8 pgs.

"International Application Serial No. PCT/US2014/040295, International Search Report mailed Mar. 10, 2015".

"International Application Serial No. PCT/US2014/040295, Written Opinion mailed Mar. 10, 2015", 12 pgs.

"U.S. Appl. No. 14/208,212, Advisory Action mailed May 4, 2016", 4 pgs.

"U.S. Appl. No. 14/208,212, Final Office Action mailed Feb. 18, 2016", 18 pgs.

"U.S. Appl. No. 14/208,212, Non Final Office Action mailed Jun. 9, 2016", 21 pgs.

"U.S. Appl. No. 14/208,212, Non Final Office Action mailed Aug. 24, 2015", 17 pgs.

"U.S. Appl. No. 14/208,212, Response filed Apr. 18, 2016 to Final Office Action mailed Feb. 18, 2016", 9 pgs.

"U.S. Appl. No. 14/208,212, Response filed Sep. 9, 2016 to Non Final Office Action mailed Jun. 9, 2016", 11 pgs.

"U.S. Appl. No. 14/208,212, Response filed Nov. 24, 2015 to Non Final Office Action mailed Aug. 24, 2015", 8 pgs.

"Australian Application Serial No. 2014244143, Examination Report No. 1 mailed Jun. 27, 2016", 3 pgs.

"Australian Application Serial No. 2014244143, Office Action mailed Oct. 14, 2016", 2 pgs.

"Chinese Application Serial No. 201480025237.3, Voluntary Amendments filed Apr. 15, 2016", (w/ English Translation of Amendments), 7 pgs.

"European Application Serial No. 14724548.4, Office Action mailed Oct. 20, 2015", 2 pgs.

"European Application Serial No. 14724548.4, Response filed Apr. 29, 2016 to Office Action mailed Oct. 20, 2015", 14 pgs.

"International Application Serial No. PCT/US2014/025754, International Search Report mailed Jun. 26, 2014", 3 pgs.

"International Application Serial No. PCT/US2014/025754, Written Opinion mailed Jun. 26, 2014", 9 pgs.

"International Application Serial No. PCT/US2014/040295, International Preliminary Report on Patentability mailed Sep. 22, 2016", 13 pgs.

* cited by examiner

DEVICE STORAGE CABINET

CLAIM OF PRIORITY

This patent application claims the benefit of priority, to U.S. Provisional Patent Application Ser. No. 61/949,737, titled "DEVICE STORAGE CABINET" to Wong et al. and filed on Mar. 7, 2014, which is hereby incorporated by reference herein in its entirety.

TECHNICAL FIELD

This disclosure pertains generally but not by way of limitation, to systems, devices, and methods for storing and charging electronic devices.

BACKGROUND

Electronic devices, such as tablets, laptops, cell phones, and personal digital assistants can require storage, battery charging, syncing, and security against theft or tampering. Businesses, schools, or institutions may use many of these electronic devices and the devices can be highly varied in size and shape. A typical electronic device can include a power or charging port, a USB port, a network port, audio ports, a video port, and a proprietary port. Not every electronic device will have all the ports mentioned above and some electronic devices can have additional ports. A proprietary port can combine the functionality of several ports. Some electronic devices might not have all the ports located on a single side of the electronic device. Many electronic devices can have a rectangular shape and many have asymmetrical features when viewed end on that distinguish between a front and back of a unit. For example, the front of an electronic device can be wider than the back or the corners on the back can include a larger or differently sized radius than corners in the front when viewed end on. Storage slots for electronic devices can be configured to conform to such asymmetrical features to ensure that the device is only loaded into a storage slot in one orientation.

OVERVIEW

This disclosure describes, among other things, a compact storage cabinet that can be used to store tablets, laptops, computers, mobile devices, or other electronic devices. The present applicants have recognized that it may be advantageous to provide a device storage cabinet that can have a narrow profile when loaded with electronic devices, such as tablets, laptops, cell phones or personal digital assistants. For example, the cabinet can be used in hallways or other narrow spaces. The cabinet can be configured with a minimum depth when it is closed and not in use. During removal or loading of electronic devices, shelves or portions of shelving that hold the devices can move out to a loading position, and increase the depth of the cabinet. After the devices have been removed, the shelves can be automatically retracted to their stowage position or retracted position.

The cabinet shelving can open up through the use of a pivoting or sliding member or drawer to allow access to remove or load the electronic devices into the cabinet. The cabinet can provide battery charging, syncing, software or data downloading, and/or software or data uploading to or from electronic devices, such as tablets, computers or phones. The cabinet can provide a secure storage space configured with locking mechanisms, such as a door or barrier. The cabinet can be vertically mounted or freestanding on a horizontal surface. The cabinet can include a power supply system, a router, networking devices, wireless devices or server devices. The stored devices can include wired connections or wireless connections, to the power supply system, network or internet. The connections between the cabinet and the electronic device can take the form of a docking station. The docking station can be disposed in a slot of a shelving assembly, and the docking station can be configured to align an electronic device as the device is positioned in the slot such that a corresponding port in the device aligns with, and connects to, a connector in the docking station.

To further illustrate the device storage cabinet, system and method disclosed herein, a non-limiting list of examples is provided here:

In Example 1, a cabinet for storing at least one electronic device can comprise a frame; a power supply system for charging the at least one device; and a shelving assembly. The shelving assembly can include a stationary member engaged to the frame; and a pivoting member engaged to the stationary member, the pivoting member adapted to hold the at least one electronic device.

In Example 2, the cabinet of Example 1 can optionally be configured such that the pivoting member has a retracted position and a loading position.

In Example 3, the cabinet of any one or any combination of Examples 1-2 can optionally be configured to further comprise a plurality of shelving assemblies.

In Example 4, the cabinet of any one or any combination of Examples 1-3 can optionally be configured such that the pivoting member is adapted to hold a plurality of electronic devices.

In Example 5, the cabinet of any one or any combination of Examples 1-4 can optionally be configured such that the shelving assembly includes a retraction member connected to the pivoting member.

In Example 6, the cabinet of Example 5 can optionally be configured such that the retraction member is configured to retract the shelving assembling without user intervention.

In Example 7, the cabinet of any one or any combination of Examples 5-6 can optionally be configured such that the retraction member is connected to the pivoting member at one of a rear portion of the pivoting member or a front portion of the pivoting member.

In Example 8, the cabinet of any one or any combination of Examples 1-7 can optionally be configured such that the shelving assembly further comprises a damper assembly.

In Example 9, the cabinet of any one or any combination of Examples 7-8 can optionally be configured such that the damper assembly further comprises a gear member.

In Example 10, the cabinet of any one or any combination of Examples 7-9 can optionally be configured such that the damper assembly further comprises a delay timer configured to delay a retraction of the pivoting member.

In Example 11, the cabinet of any one or any combination of Examples 7-10 can optionally be configured such that the damper assembly further comprises a gear track.

In Example 12, the cabinet of any one or any combination of Examples 1-11 further comprising a display.

In Example 13, the cabinet of any one or any combination of Examples 1-12 can optionally be configured to further comprise a connection to a network.

In Example 14, the cabinet of Example 13 can optionally be configured such that the network connection includes a wireless connection.

In Example 15, the cabinet of any one or any combination of Examples 1-14 can optionally be configured to further comprise a docking station disposed in the pivoting member.

In Example 16, the cabinet of any one or any combination of Examples 1-15 can optionally be configured such that the frame defines a front compartment that is configured to house at least one component of the power supply system.

In Example 17, an apparatus for storing at least one electronic article, can comprise: a frame; a power supply system for charging the at least one electronic article; a network connection configured to connect the at least one electronic article to a network; a stationary member connected to the frame; a pivoting member connected to the stationary member; a retraction member engaged to the pivoting member; a door having a security lock; and a damper assembly engaged with at least one of the pivoting member and the stationary member. The damper assembly can include a damper and a damper gear track; wherein the pivoting member has a retracted position and a loading position, and wherein the retracted position is a substantially vertical position and the loading position is an angled position.

In Example 18, the apparatus of Example 17 can optionally be configured such that the angle of the angled position is substantially between 15 and 65 degrees.

In Example 19, an apparatus for storing at least one electronic article can comprise: means for charging the at least one electronic article; an enclosure having at least one storage shelf, the at least one shelf including a stationary member and a moving member, the moving member configured to move from a retracted position to a loading position and defining at least one space to store the at least one electronic article; and means for automatically retracting the moving member to a retracted position.

In Example 20, the article of Example 19 can optionally be configured such the means for retraction includes a retraction member connected to the moving member.

In Example 21, the cabinet or apparatus of any one or any combination of Examples 1-20 can optionally be configured such that all elements, operations, or other options recited are available to use or select from.

These and other examples and features of the device storage cabinet, system, and method will be set forth in part in the following Detailed Description. This Overview is intended to provide non-limiting examples of the present subject matter—it is not intended to provide an exclusive or exhaustive explanation. The Detailed Description below is included to provide further information about the present device storage cabinet, system, and method.

BRIEF DESCRIPTION OF THE DRAWINGS

In the drawings, like numerals can be used to describe similar elements throughout the several views. Like numerals can be used to represent different views or configurations of similar elements. The drawings illustrate generally, by way of example, but not by way of limitation, various embodiments discussed in the present document.

DETAILED DESCRIPTION

Figure 1:
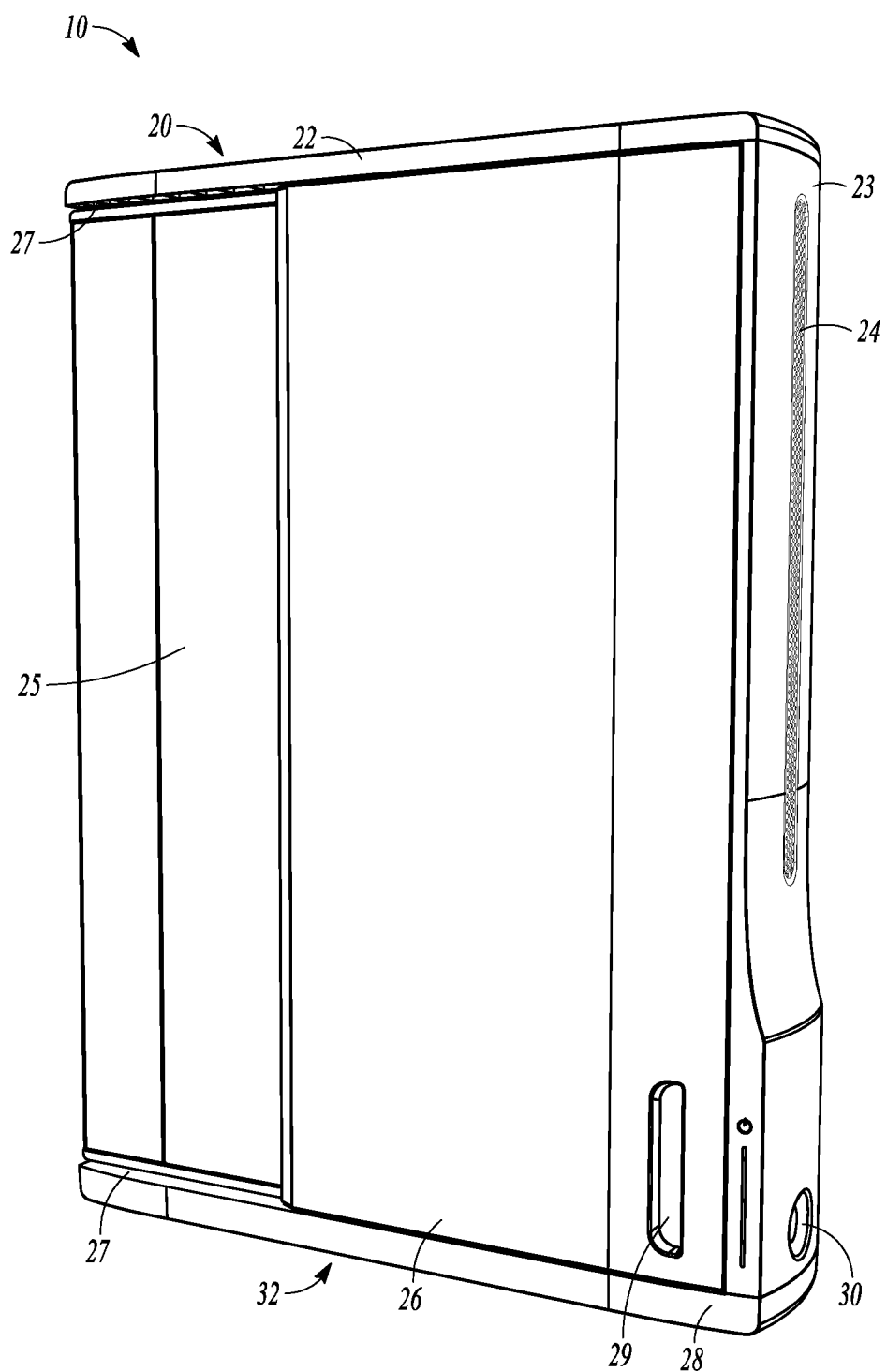
FIG. 1 illustrates an isometric view of an electronic device storage cabinet as constructed in accordance with at least one embodiment.

The following detailed description is exemplary in nature and is not intended to limit the scope, applicability, or configuration of the invention in any way. Rather, the following description provides some practical illustrations for implementing exemplary embodiments of the present invention. Examples of constructions, materials, dimensions, and manufacturing processes are provided for selected elements, and all other elements employ that which is known to those of ordinary skill in the field of the invention. Those skilled in the art will recognize that many of the noted examples have a variety of suitable alternatives.

Embodiments described herein provide systems, devices, and methods for storing and/or charging and/or networking one or more electronic device, such as a tablet, a laptop, a mobile phone, a personal assistant or a combination of such devices. Typically, electronic devices, such as described have a battery that needs to be periodically charged, software that may need to be periodically updated or maintained, and data that may need to be backed up from, or transferred to the device.

In one embodiment, an electronic device charging and syncing cabinet can be configured with one or more tilting or pivoting shelves. The shelves can pivot forward to allow the electronic devices to be released from the cabinet or input into the cabinet. The pivoting shelves can include an auto-retract function which can return the pivoting shelf to a vertical stowage position or retracted position. The auto-retract function can use an elastomeric device or energy storing device, such as a torsion spring, a spring, an extension spring, a rubber member, a hydraulic actuator, a compressed air actuator or a motorized actuator. The auto-retract function can be configured to operate by gravity. The auto-retract function can be configured to operate with a delay timer. The shelf can have a detent or locking mechanism that can keep the shelf in an open position until an automatic or manual actuator allows the auto-retract function to operate.

In another embodiment the auto-retract mechanism can have a damper device to slow down the return motion to the stowage or retracted position. A friction device may be used for slowing down the return motion of the tilting shelf. The damper can be one directional or unidirectional, or provide varying speeds of opening and/or closing. The damper can be adjusted manually or electronically.

In another embodiment in a cabinet having more than one shelf, the shelves can be linked to operate together. In other words, if one shelf is opened or closed, other shelves in the cabinet will open or close also. The linkage can be mechanical or electronic.

In another embodiment, shelves may be pulled out straight instead of tilting. A shelf can be guided by glides or slides. A linear damper or friction can be used in this configuration. Also, any other mechanism, e.g., a linkage assembly may be installed under the shelf to provide an auto-retract function. Elastomeric devices providing the auto-retract function can be disposed at the rear or on the sides of the movable shelf.

FIG. 1 illustrates a device storage cabinet (or "cabinet") 10. The cabinet 10 can include a frame 20. The frame 20 can include a top 22, a right side 23 and a base 28. The frame 20 can include a door 26 and a compartment 25. The frame 20 can act as a structural enclosure of the cabinet 10. Although the frame 20 is illustrated as rectangular it can be sized and shaped in any manner to fit a particular location or use. The base 28 can be much wider than the example that is shown. For example, the base 28 can be wide enough to provide stability for a cabinet 10 that is disposed on a horizontal surface or free standing on a horizontal surface.

The door 26 is shown in a door closed position 32. The door 26 can include a handle 29 to provide a means to open and close the door. The frame 20 can include a lock 30 for the door 26. The frame 20 can include slide tracks 27 that allow the door 26 to be slid, e.g., to the left as shown in FIG. 1, for opening. The door 26 can be configured in any size needed and, in some example configurations, can include a hinge to allow the door to swing open instead of slide open.

In some examples, a right side 23 of the frame 20 can include a side vent 24. The frame 20 can be configured with venting at any position needed and can include electronic fans or air conditioning means to provide any cooling needed for electronic devices stored in the cabinet 10. The frame 20 can be of a unitary or a multiple part construction and the frame 20 and/or its components can be manufactured in whole or in combinations of metal, plastics, composites, wood, or any other suitable material strong enough to provide an enclosed cabinet.

The compartment 25 can include charging or networking hardware, such as power supplies, relays, computers, servers, or routers that can aid in charging, networking, or syncing of electronic devices stored in the cabinet 10. Such power supply, networking, routing or other devices can be located throughout the cabinet 10, or stored in the compartment 25 that can be accessed for maintenance, for example.

A power supply system 106 can include wiring and/or connectors for transmitting electrical power. The power supply system can include one or more transformers, inverters, power conditioners, filters, regulators or other power supply devices. In some examples, the power supply system can be wireless.

Figure 2:
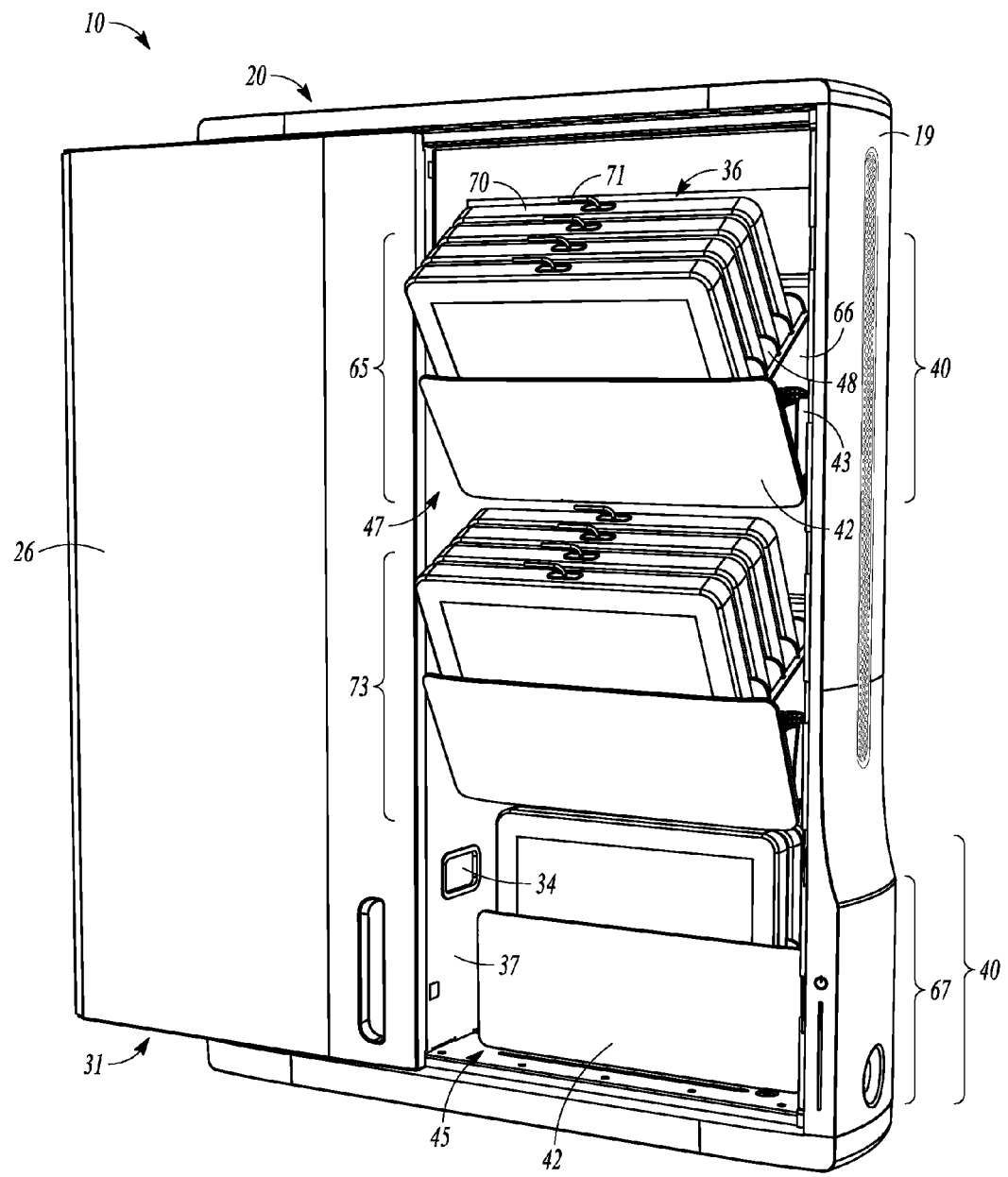
FIG. 2 illustrates an isometric view of an electronic device storage cabinet and interior shelving assemblies as constructed in accordance with at least one embodiment.

FIG. 2 illustrates an example of a cabinet 10 with the door 26 in a door open position 31 which can reveal the cabinet interior 36. The cabinet interior 36 can include one or more shelving assemblies 40. The one or more shelving assemblies 40 can include a movable member 66, a stationary member 43. The movable member 66 can be adapted to hold one or more electronic devices 70. The shelving assemblies 40 can be arranged in any manner in accordance with the size and shape of the electronic devices 70 that the cabinet 10 is configured to hold. Each shelving assembly 40 can be configured to hold more than one type of device, such as a mobile phone and a tablet. The example configuration depicted in FIG. 2 includes three shelving assemblies 40, namely an upper shelving assembly 65, a middle shelving assembly 73, and a lower shelving assembly 67.

In some examples, each cabinet 10 can be configured to include more than one type of shelving assembly 40. For example, one shelving assembly 40 could be dedicated to store a first tablet device(s) with a certain exterior size and/or shape and/or configuration of connecting ports and another shelving assembly 40 can be dedicated to store a second tablet device(s) with a different exterior size and/or shape and/or configuration of connecting ports. Each shelving assembly 40 can include the movable member 66 and the stationary member 43. The upper shelving assembly 65 is shown in a loading position 47 in which at least the movable member 66 can be repositioned to allow loading or removal of electronic devices 70 to or from the movable member 66. When a door 26, if present, is in the door open position 31, at least a portion of the movable member 66 can protrude from the general vertical plane of the front of the frame 20. The lower shelving assembly 67 is illustrated in a retracted position 45 in which a front face 42 does not generally protrude from the vertical plane of the front of the frame 20, or has been returned to a generally vertical position.

The movable member 66 can be configured to pivot as shown in FIG. 2 and as such can be noted as a pivoting member 41. The pivoting member 41 can be attached near a lower forward edge by such means as a hinge assembly 52 (see FIG. 4) to a stationary member 43. The stationary member 43 will be more fully described below and can be integrally formed or separately attached to the frame 20. Multiple components providing structures similar to the unitary stationary member 43 can provide supported hingeable attachment points for the pivoting member 41 (e.g. a separate left half of a stationary member 43 can be attached to a left side of the frame 20 and a separate right half of a stationary member 43 can be attached to the right side of the frame 20).

In some example configurations, the shelving assemblies 40 can be arranged in a space saving manner in cabinet 10, such that the electronic devices 70 cannot be unloaded or loaded from the movable member 66 when the movable member 66 is in a retracted position 45. When the movable member 66 has been pulled or tilted forward as shown in a loading position 47 as in the upper shelving assembly 65, there can be clearance to load or unload the electronic devices from the movable member 66. In example configurations that include multiple shelving assemblies 40 having pivoting configurations, the assemblies can be configured to pivot forward or retract inwards either together, e.g., in unison, or individually. If the movement of the shelving assemblies 40 is configured to be in unison, one drawer or movable member 66 can be pulled forward, or caused to actuate forward and one or more additional movable members 66 can move forward or be tilted forward at the same time. The multiple movement of movable members 66 can be accomplished through mechanical linkages connecting the movable members 66, electronic means, such as wiring, sensors and electronic actuators or a combination of both mechanical and electronic means.

Because of angled loading or removal of the electronic devices 70, each pivoting member 41 can be accessed even if more than one pivoting member 41 is in the loading position 47, such as the upper shelving assembly 65 and a middle shelving assembly 73. Movement of the movable members 66 can be accomplished manually or automatically. Automatic movement of the movable members 66 can be accomplished by electronic, hydraulic, or air-powered motors, for example, which can be configured to move the movable member at the press of a button or a remotely activated switch. The position of the movable member 66 can be monitored by electronic or mechanical sensors that can determine whether the movable member is in a retracted position 45 or a loading position 47 or at some point in between the two positions. If the sensor indicates that the movable member has stopped between a refracted position 45 and a loading position 47 an error message can be initiated. In one non-limiting example, an angle of the pivoting member 41 when in a loading position 47 in relation to a vertical plane can range from 15-65 degrees. In one non-limiting example, an angle of the pivoting member 41 when in a loading position 47 in relation to a vertical plane can range from 20-55 degrees. In one non-limiting example, an angle of the pivoting member 41 when in a loading position 47 in relation to a vertical plane can range from 30-45 degrees.

The electronic devices 70 stored in the cabinet 10 can be connected to charging devices and/or networking devices. U.S. patent application Ser. No. 13/650,572 titled "Tablet Storage Device" filed Oct. 12, 2012 describes systems and methods for connecting electronic devices to charging and networking devices and is incorporated herein by reference in its entirety.

Openings, such as a wiring aperture 34 on an interior wall 37 of the cabinet interior 36 can provide an opening for wiring or cabling connections connecting devices in the compartment 25 (see FIG. 1) to electronic devices 70 placed in the shelving assemblies 40 of the cabinet 10. The connections between the cabinet 10 and the electronic device 70 can take the form of a docking station 102 or a connector 103 (see FIG. 6). Wiring or cabling connecting the electronic devices 70 to power supplies or networking can be accomplished by any means known to those skilled in the art and is not limited by the present description. Electronic devices 70 can be configured in a wide range of shapes and sizes and slots 48 can be configured to orient the electronic device 70 in a particular manner. A front face 42 of a movable member 66 can include placarding instructing how electronic devices 70 should be placed in the slots 48. The electronic devices 70 can include wireless antennas 71.

Figure 3:
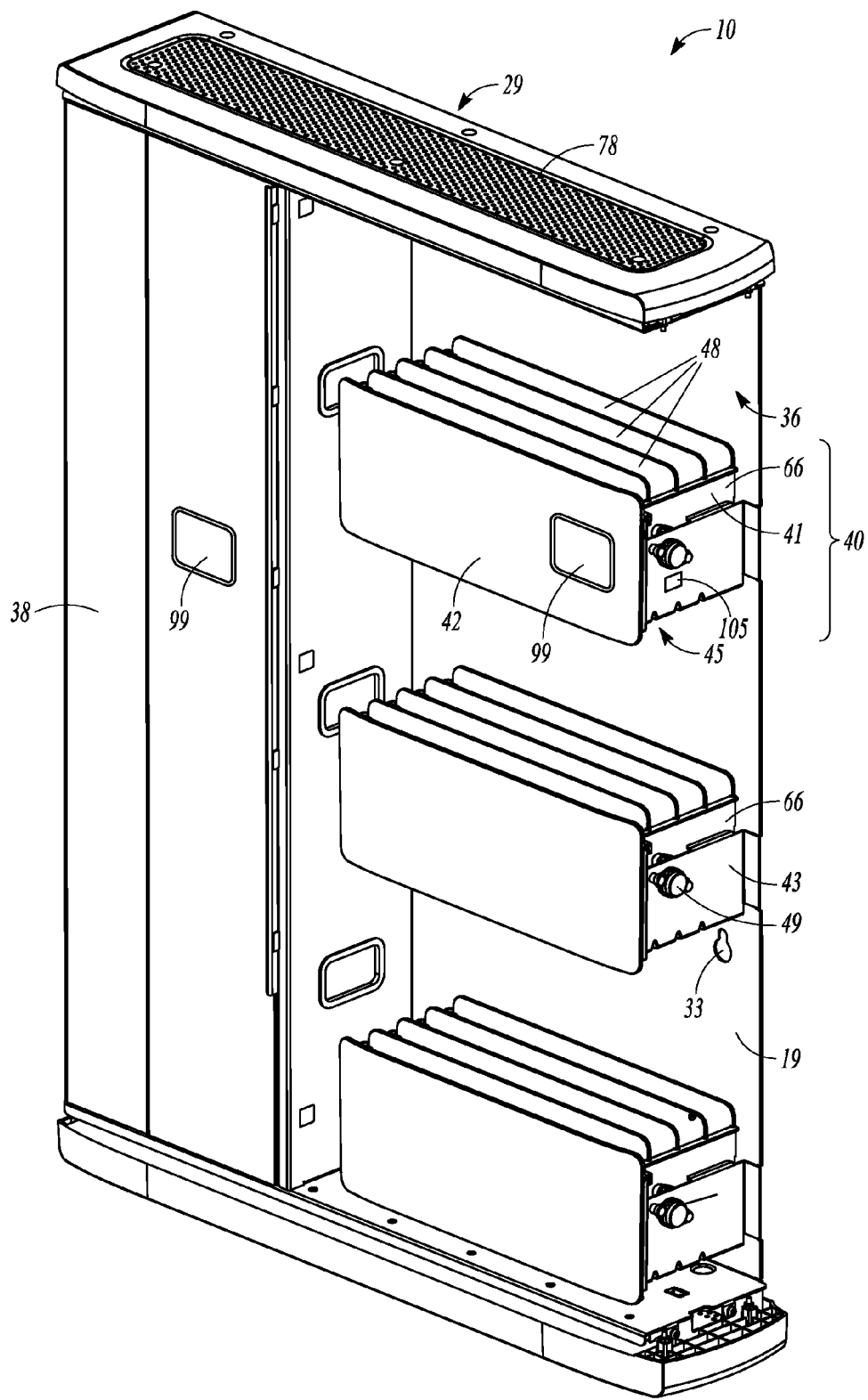
FIG. 3 illustrates an isometric view of an electronic device storage cabinet with a side wall and door removed as constructed in accordance with at least one embodiment.

FIG. 3 illustrates a cabinet 10 with a right side wall 23 and a door 26 (see FIG. 2) removed for viewing purposes. The cabinet 10 can include a frame 20, a display 99, and one or more shelving assemblies 40. The shelving assemblies 40 can include a movable member 66 and a stationary member 43. The frame 20 can include a top vent 78 that can aid in ventilating or cooling the electronic devices 70 (see FIG. 2) stored in the cabinet 10. The cabinet interior 36 can include illumination that can be manually or automatically switched on or off, such as by sensors or switches sensitive to movement of the door 26 (see FIG. 2) The cabinet interior 36 can include three shelving assemblies 40, for example, as shown in FIG. 3, or any number of shelving assemblies 40 that can be suited for a particular storage capacity or size and type of electronic device 70 (see FIG. 2). The movable members 66 can be configured as pivoting members 41 and are illustrated in a retracted position 45, with the front face 42 in a generally vertical position and generally receded far enough from a front plane of the frame 20 so that if a door 26 is present (see FIG. 2), the door 26 can be closed. The shelving assembly 40 can include a damper 49 which can be configured to control a movement speed of the movable member 66. The movement speed can be controlled in an opening direction or a closing direction and the speeds can be different in each direction. The damper can prevent damage to electronic devices that might result from a movable member 66 retracting too quickly. The damper 49 can be attached to the stationary member 43.

The cabinet 10 can include a rear wall 19 which can be configured to fit against or be attached to a flat surface, such as a wall of a building. The rear wall 19 or another surface of the cabinet 10 can include a mounting aperture 33 that can aid in mounting the cabinet 10 to another structure or surface. Each movable member 66 can include one or more slots 48 defined by dividers 61 and configured to hold an electronic device 70 (see FIG. 2). Although the movable member 66 is shown with a plurality of slots 48 defined by a plurality of dividers 61, the movable member 66 can be configured without dividers 61 such that the movable member 66 defines a single space that can hold one or more electronic devices 70. One or more of the dividers 61 can be configured to direct or align the placement of the electronic device 70. The direction can be accomplished by a form fitting divider 61 and/or the structure surrounding the slot 48 that can allow the electronic device 70 to be placed in the slot 48 in a particular orientation. The divider 61 and/or the structure surrounding the slot 48 can include asymmetrical features that can correspond to asymmetrical features of an electronic device 70. The divider 61 and/or the structure surrounding the slot 48 can be molded for a particular brand or model of an electronic device 70 and can include connectors 103 (see FIG. 6) in the interior of the slot 48 that correspond to ports on the electronic device 70, such as a charging port, a USB port, audio ports, networking ports or proprietary ports. As the electronic device 70 is placed in a slot 48, connectors 103 can directly connect to ports of the electronic device 70. In another example, the cabinet 10 can include wired connectors, such as pig-tail connectors or patch cords, that can be connected to ports of the electronic device either before or after placement in the movable member 66. The cabinet 10 can be configured to provide all or any combination of the functions of battery charging, networking, syncing, or security of the electronic devices in a wireless mode.

The display 99, such as an electronic display, can be located on the cabinet exterior 38, in the cabinet interior 36 or on a portion of the shelving assembly 40, such as the front face 42. The display 99 can provide information to a user, such as a charging state, a networking state (e.g., an indicator indicating whether an electronic device 70 is linked to a network), a configuration state (e.g., an indicator indicating that a particular software program has been downloaded to the electronic device 70 in the cabinet 10 or slot 48), an electronic device 70 presence state (e.g., an indicator indicating whether the electronic device 70 is present in the slot 48), or cabinet security state (e.g., an indicator indicating that the cabinet 10 is locked or open). The display 99 can be an LCD screen, a touchscreen or a series of LED lights, for example.

In some examples, the information that can be displayed on the display 99 can be accessed remotely such as by a networked computer or by accessing the internet. A school, institution, or business can provide a plurality of connected cabinets 10 and the charging status, syncing status, or security status of the electronic devices 70 held in the cabinets 10 can be monitored at each cabinet 10 or remotely at one or more locations.

Figure 4:
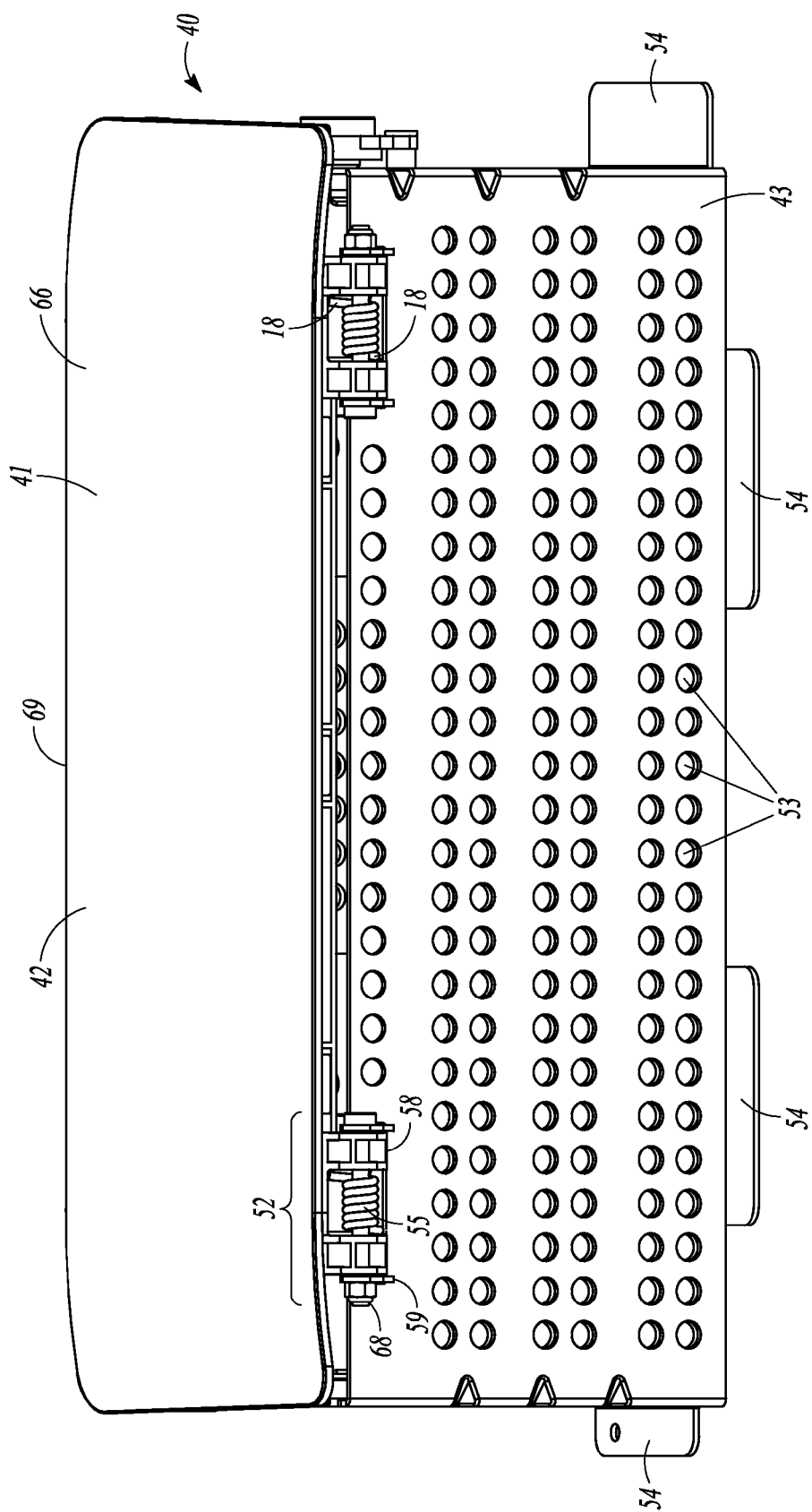
FIG. 4 illustrates a bottom view of a shelving assembly, as constructed in accordance with at least one embodiment.

FIG. 4 illustrates a bottom view of a shelving assembly 40. The shelving assembly 40 can include a movable member 66, a stationary member 43, and a hinge assembly 52. The movable member 66 can be a pivoting member 41 and can be attached to the stationary member 43 at one or more hinge assemblies 52. The hinge assembly 52 can include a torsion spring 55 which can provide force to automatically retract a pivoting member 41 from a loading position 47 to a retracted position 45 (see FIG. 2). One leg 18 of the torsion spring 55 can be attached to the stationary member 43, and another leg 18 can be attached to the pivoting member 41. Spring tension can increase as the pivoting member 41 is tilted forward. This increased tension can provide torque sufficient to return the pivoting member 41 to the retracted position 45 without intervention by a user, e.g., automatically.

In an example configuration, the hinge assembly 52 can include a fastener 68 that can be positioned through pivoting member hinge tabs 58 and stationary member hinge tabs 59. In another example, a hinged attachment between the pivoting member 41 and the stationary member 43 can be accomplished in any manner known to those skilled in the art (e.g. a continuous hinge, a concealed hinge, a pin and socket).

In an example, the stationary member 43 can include one or more attachment tabs 54 that can provide a structure to attach the stationary member 43 to the frame 20 (see FIG. 2). Structures that can provide functions of the stationary member 43 such as providing an attachment point for the pivoting member 41 can be integral to the frame 20 and can protrude from one or more portions of the frame 20. Such structures can be unitary for each shelving assembly 40, as an example of the stationary member 43 or separate structures that can support each hinge assembly 52 of the pivoting member 41. The stationary member 43 can include a series of holes 53 that can serve one or more purposes such as material lightening or ventilating.

The movable member 66 can include gripping means such as a handle. In an example, the top edge 69 of the front face 42 of the pivoting member 41 can be grasped by a user and the pivoting member 41 can be pulled forward (see FIG. 2) to the loading position 47.

Figure 5:
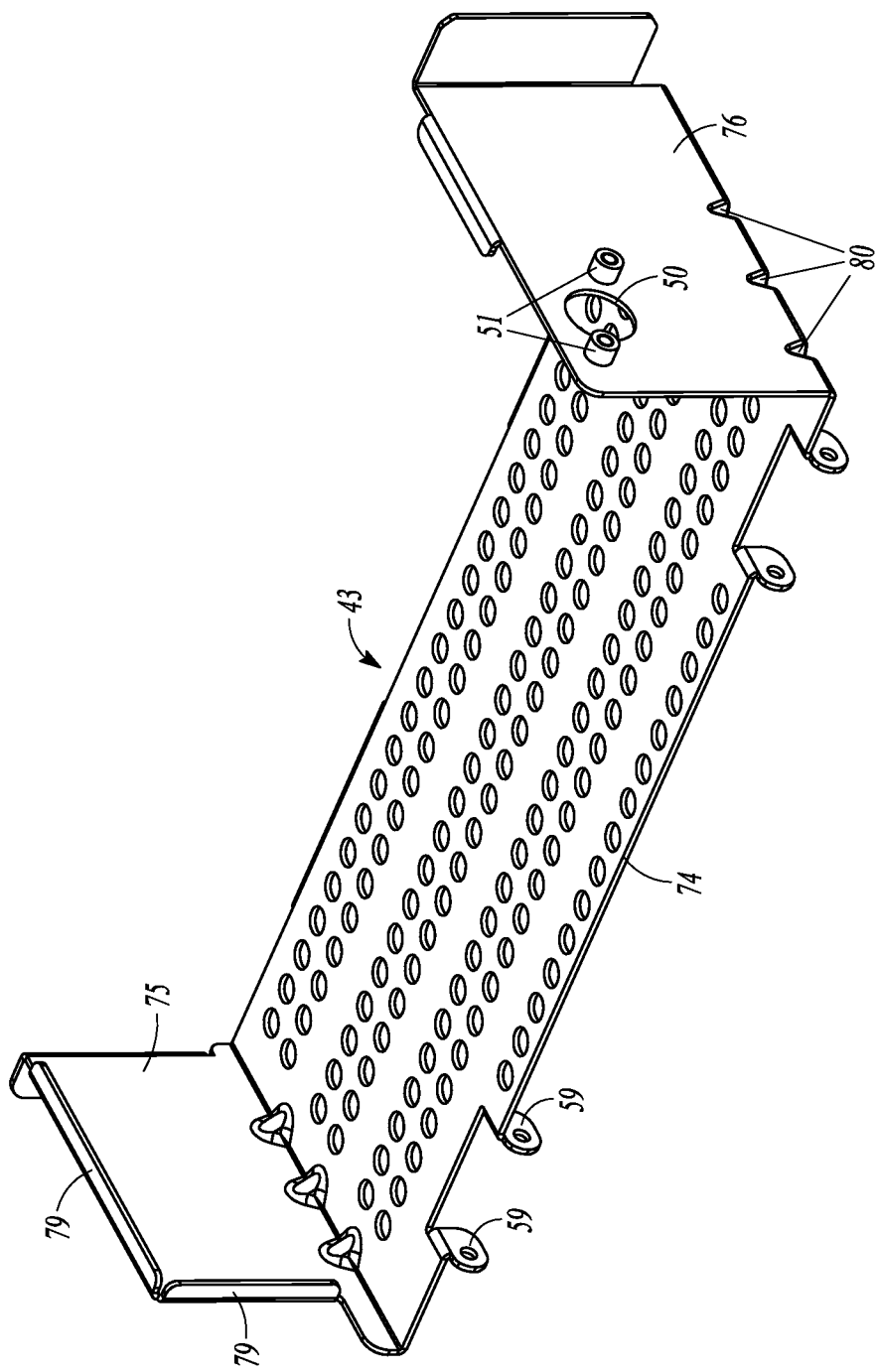
FIG. 5 illustrates an isometric view of a stationary member as constructed in accordance with at least one embodiment.

FIG. 5 illustrates an example of a stationary member 43. The stationary member can include a U-shape formed by a bottom 74, a left stationary side 75, and a right stationary side 76. The stationary member hinge tabs 59 can be positioned at a forward portion of the bottom 74. Strengthening features, such as folded edges 79 and corner indents 80 can provide structural strength for the stationary member 43. The stationary member 43 can include a damper aperture 50 and fastening members 51 for the operation and attachment of a damper 49 (See FIG. 2 and FIG. 7).

Figure 6:
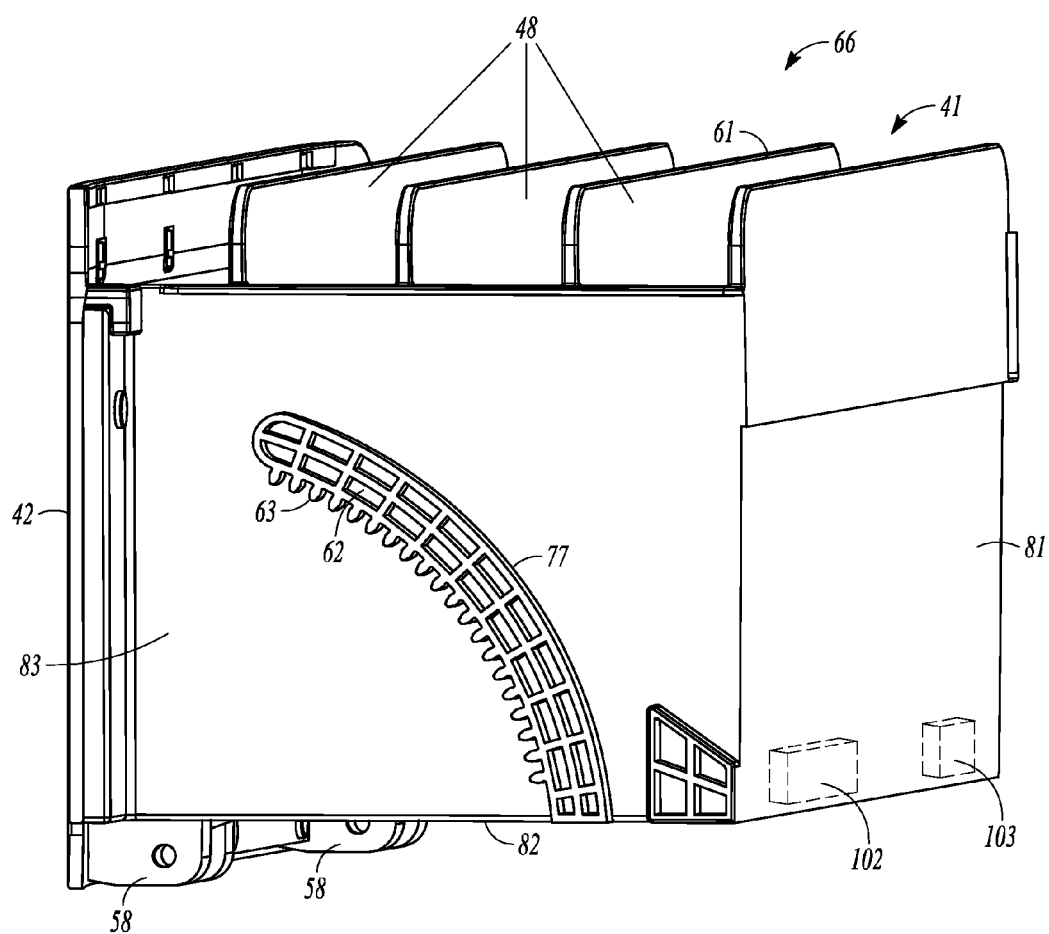
FIG. 6 illustrates an isometric view of a pivoting member as constructed in accordance with at least one embodiment.

FIG. 6 illustrates a movable member 66 that can include a front face 42, a rear face 81, a bottom face 82, side faces 83, a gear track 62, one or more dividers 61 that define slots 48, pivoting member tabs 58, a docking station 102, and a connector 103. The movable member 66 can be configured as a pivoting member 41. The pivoting member 41 can include one or more dividers 61 defining slots 48. The dividers 61 can engage interior surfaces of any or all of the structures forming the side faces 83, the bottom face 82, the front face 42, or the rear face 81. Each slot 48 can provide a space to insert and store one or more electronic devices 70 (see FIG. 2). One or more side faces 83 can include one or more gear tracks 62. The gear track 62 can be configured in an arc 77 that corresponds to or defines a pivoting movement of the pivoting member 41 as the pivoting member 41 is moved from a retracted position 45 to a loading position 47 (see FIG. 2) or vice versa from a loading position 47 to a refracted position 45. The gear track 62 can include a plurality of gear track teeth 63 that can be configured to mesh with a damper gear 64 (see FIG. 8). The gear track 62 can be integral with the side face 83 or attached to the side face 83. The gear track 62 can be configured to operate with a motorized gear in an example of a motorized pivoting member 41 operation. The pivoting member tabs 58 can be seen located near a lower portion of the front face 42 and can provide an attachment point for a hinge assembly 52 (see FIG. 4). One or more slots 48 can include a connector 103 for connection to an electronic device 70. The connector 103 can be attached directly to the pivoting member 43. One or more slots 48 can include a docking station 102 for connection to an electronic device 70. The docking station 102 can be disposed in a slot 48 of a shelving assembly 40, and the docking station 102 can be configured to align an electronic device 70 as the device is positioned in the slot 48 such that one or more corresponding ports in the electronic device 70 aligns with, and connects to, one or more connectors in the docking station 102.

Figure 7:
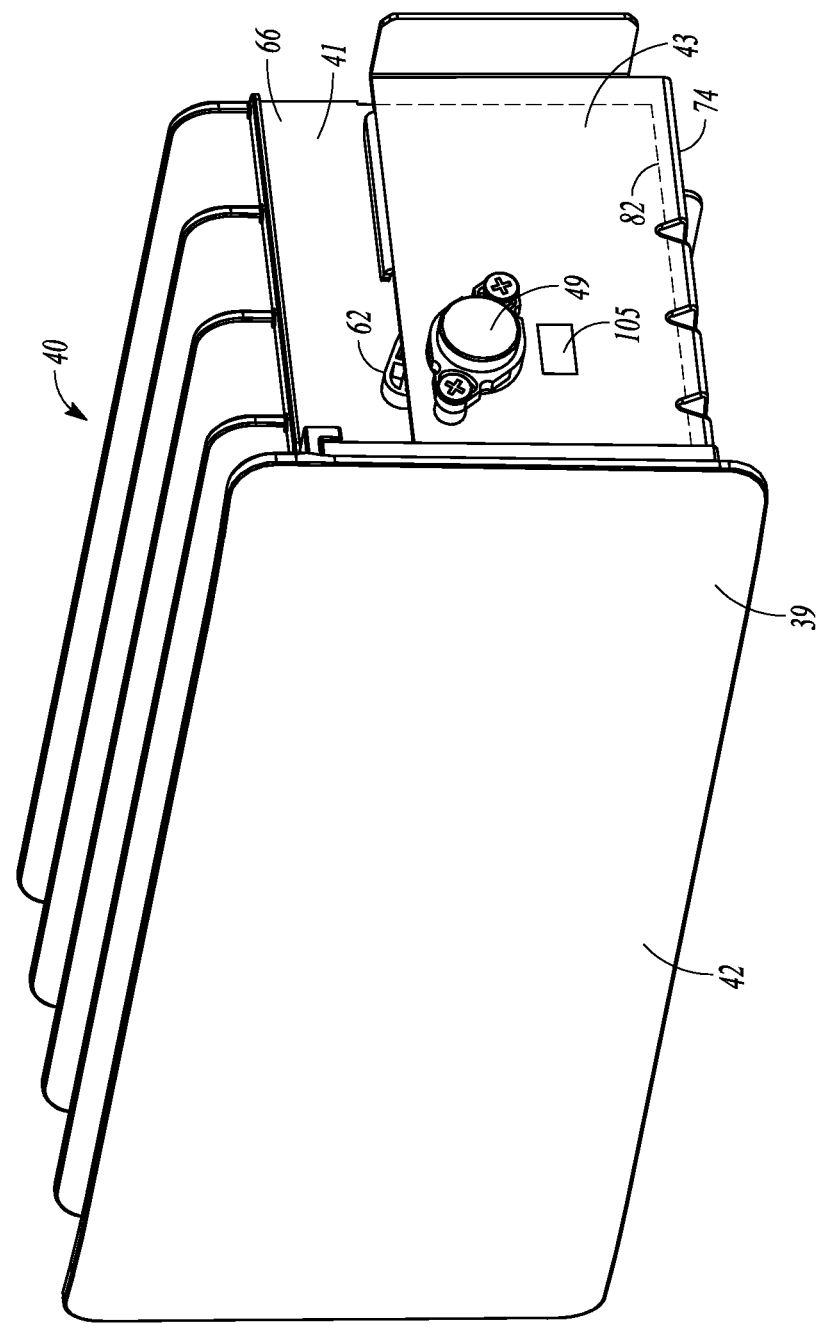
FIG. 7 illustrates an isometric view of a shelving assembly with the pivoting member in a retracted position, as constructed in accordance with at least one embodiment.

FIG. 7 illustrates an example of a shelving assembly 40. The shelving assembly can include a movable member 66, a stationary member 43, a damper assembly 49 and a gear track 62. The movable member 66 can be configured as a pivoting member 41 and is shown in a retracted position 45 with the front face 42 in a vertical position 39 and the bottom face 82 of the pivoting member 41 in close proximity to the bottom 74 of the stationary member 43. The damper assembly 49 can be fastened to the stationary member 43 and can include a gear 64 (see FIG. 8) that can mesh with the gear track 62.

Figure 8:
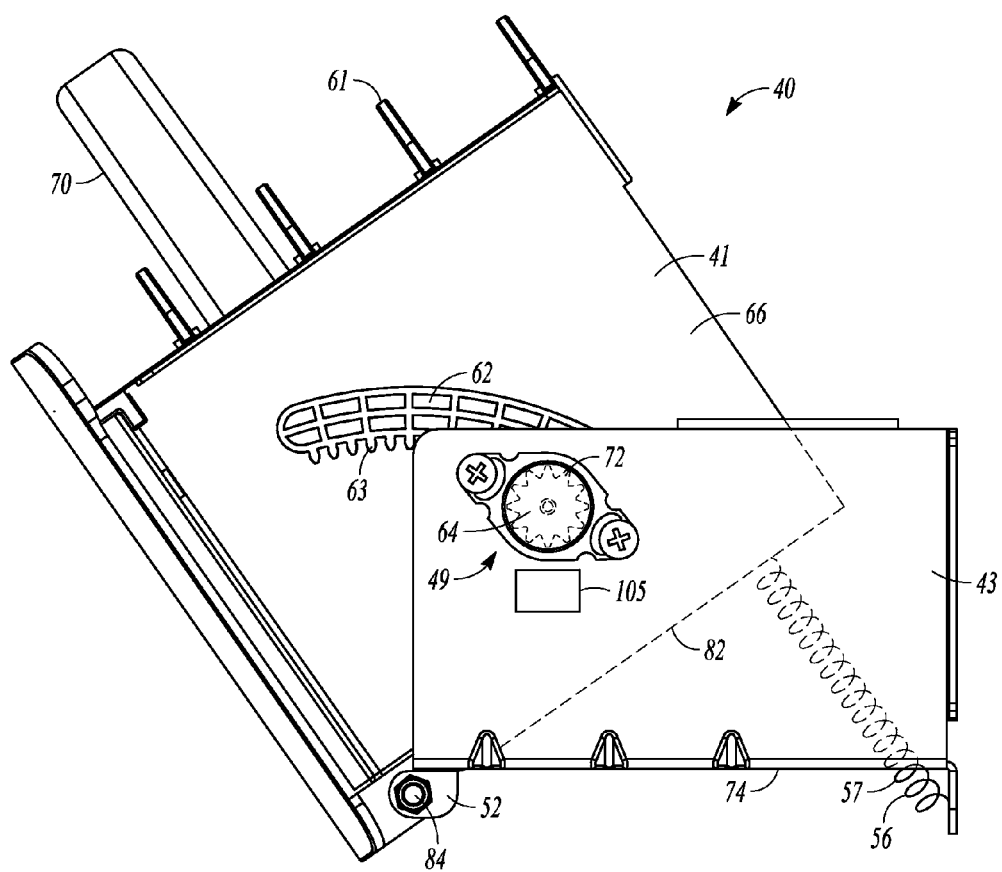
FIG. 8 illustrates a side view of a shelving assembly with the pivoting member in an extended position, as constructed in accordance with at least one embodiment.

FIG. 8 illustrates a shelving assembly 40 including a movable member 66, a stationary member 43, dividers 61, a damper assembly, a gear track 62, a hinge assembly 52 and a retraction member 57. The movable member 66 can be configured as a pivoting member 41. The pivoting member 41 can be tilted forward to a loading position 47 where electronic devices 70 can be stored into or removed from the pivoting member 41. The pivoting member 41 can swing about an axis 84 provided at the hinge assembly 52. Hidden lines denoting the position of a gear 64 that is part of the damper assembly 49 show how the gear teeth 72 can mesh with the gear track teeth 63 of the gear track 62. The damper assembly 49 can include any means known to those skilled in the art to damper an extension or retraction speed of the movable member 66, such as friction means, spring means, or motorized means. The damper speed can be adjustable.

In an example, the shelving assembly can include a retraction member 57 that is attached near the bottom face 82 of the pivoting member 41. Such a retraction member 57 could include an extension spring 56 that is attached at one end to the pivoting member 41 and at the other end to a surface of the frame 20 (see FIG. 3) or a portion of the stationary member 43. Such an extension spring 56 can be used alone or in combination with the torsion spring 55 described above (see FIG. 4).

Figure 9:
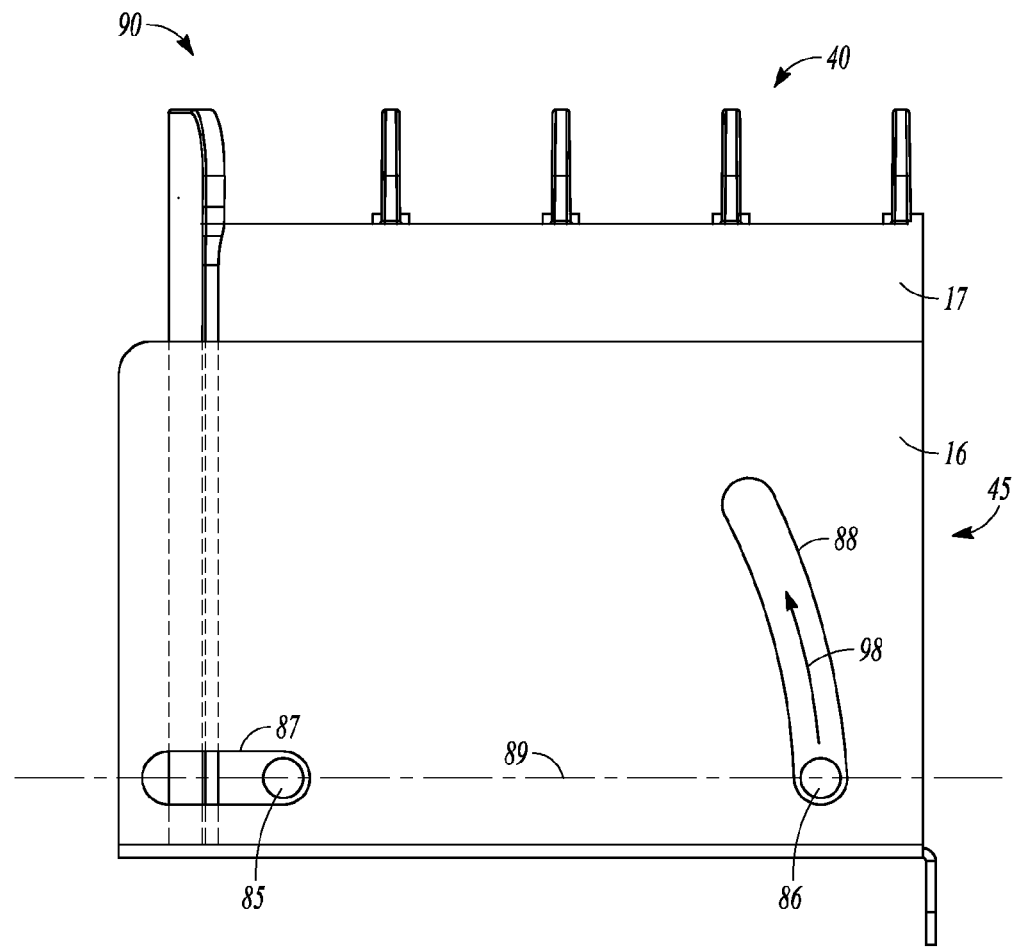
FIG. 9 illustrates a side view of components of a gravitational shelving assembly with a gravitational retract mechanism in an retracted position, as constructed in accordance with at least one embodiment.
Figure 10:
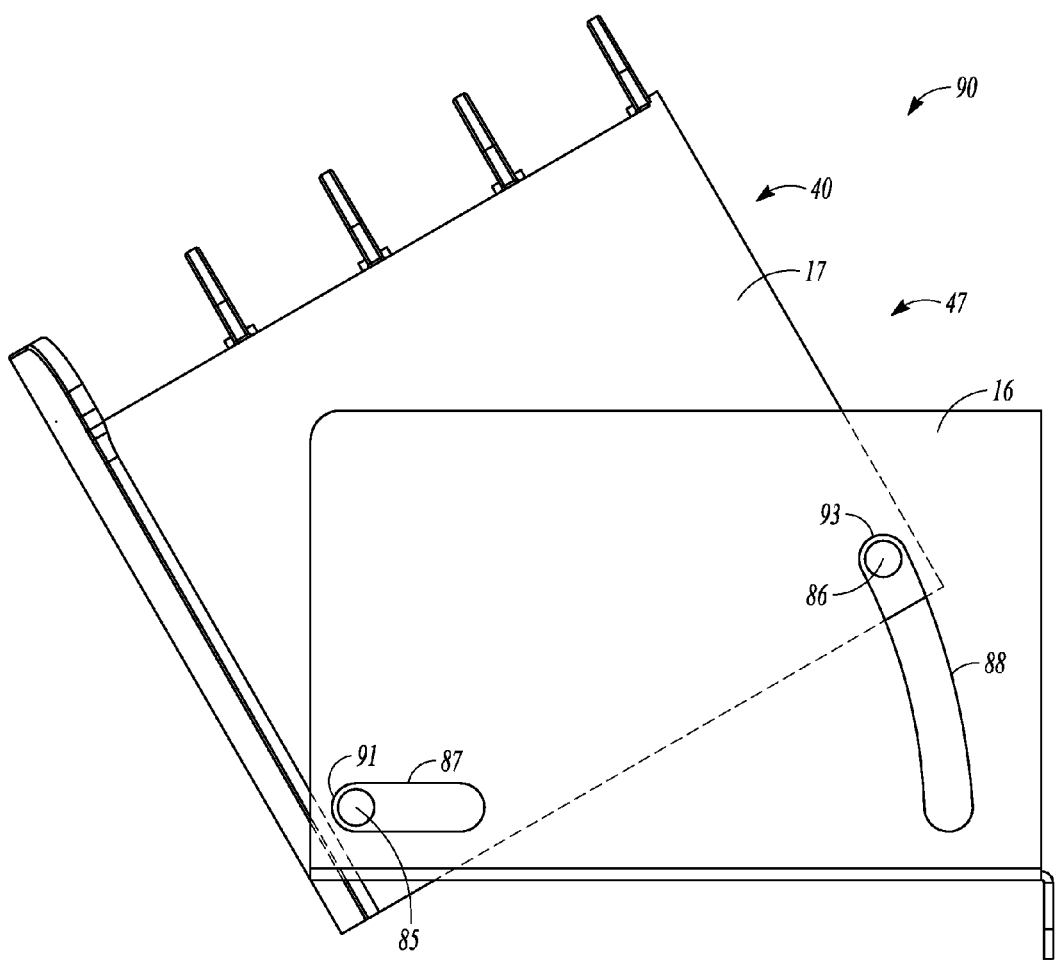
FIG. 10 illustrates a side view of components of a gravitational shelving assembly with a gravitational retract mechanism in a loading position, as constructed in accordance with at least one embodiment.

FIGS. 9-10 illustrate a shelving assembly 40 that is configured as a gravity retraction shelving assembly 90. The gravity retraction shelving assembly 90 can include a gravity pivoting member 17, a gravity stationary member 16, a forward pin 85, a rear pin 86, a forward slot 87 and a rear slot 88. The gravity pivoting member 17 can use gravity for a retraction mechanism as part of the gravity retraction shelving assembly 90. The gravity pivoting member 17 can include a forward pin 85 and a rear pin 86 that can extend outwardly from side surfaces of the gravity pivoting member 17 and can be positioned along a generally horizontal line 89. The positioning of the pin 85, 86 can vary from horizontal line 89. The gravity stationary member 16 can include a rear slot 88 and a forward slot 87. The forward slot 87 can generally be oriented in a horizontal position, while the rear slot 88 can be configured to correspond to an arc of movement 98 of the rear pin 86 as the gravity pivoting member 17 is moved from a refracted position 45 to a loading position 47 (see FIG. 10).

All or any combination of the forward pin 85, the rear pin 86, the forward slot 87, or the rear slot 88 can be configured to provide a camming function so that the gravity pivoting member 17 can be moved forward smoothly and when a user lets go of the gravity pivoting member 17, the gravity pivoting member 17 can fall back into a retracted position 45 automatically. The slots 87, 88 and pins 85, 86 can also be configured such that the camming function can cause the movement to be slowed as the gravity pivoting member 17 nears the retracted position 45 so that it does not cause any damage to the electronic devices stored within.

The retraction movement of such a gravity pivoting member 17 can also be slowed by a damper assembly 49 as previously described. The forward slot 87 can be configured such that the gravity pivoting member 17 not only tilts forward, but slides forward as well. The rear slot 88 can be configured to control any forward and backward sliding of the forward pin 85.

FIG. 10 illustrates the gravity retraction shelving assembly 90 with the gravity pivoting member 17 in a loading position 47. The forward pin 85 can be located at the forward end 91 of the forward slot 86. The movement of the gravity pivoting member 17 and the rear pin 86 is limited by the upper end 93 of the rear slot 88. The position of the upper end 93 can cause the forward pin 85 to slide to the forward end 91 of the forward slot 87. The slots 87, 88 and/or pins 85, 86 can be configured such that a slight push can be used to initiate the refraction movement of the gravity pivoting member 17 or an operator can release hold of the gravity pivoting member 17 and gravity pivoting member 17 can be balanced or weighted to return to the retracted position 45 that is shown in FIG. 9. The mechanisms described above such as the slots and pins, can be interchanged between the gravity pivoting member 17 and the gravity stationary member 16 (e.g. the gravity stationary member could have the pins and the gravity pivoting member the slots).

Figure 11:
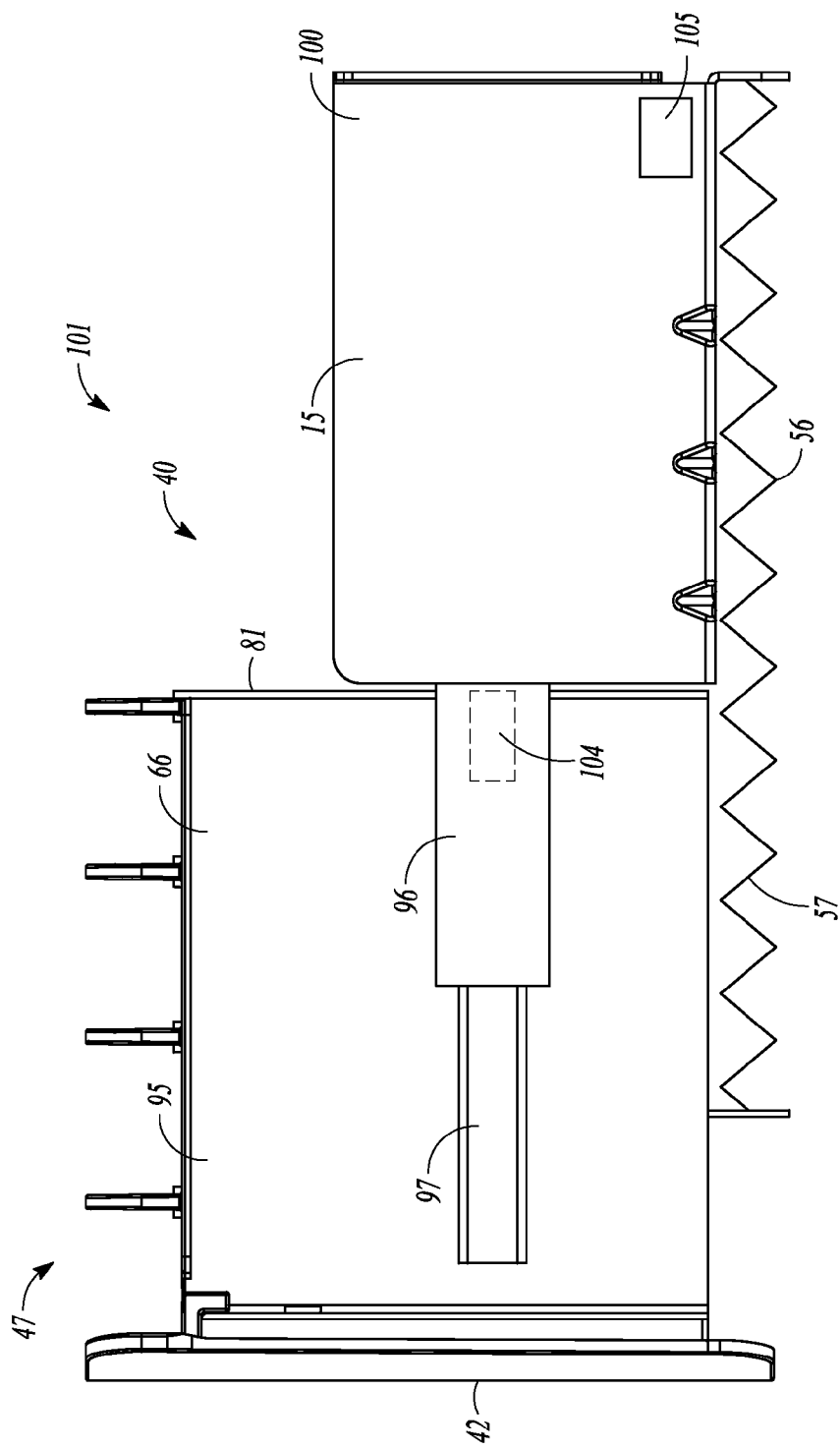
FIG. 11 illustrates a side view of components of a shelving assembly with a sliding mechanism in a loading position, as constructed in accordance with at least one embodiment.

FIG. 11 illustrates a shelving assembly 40 that is configured as a sliding shelving assembly 101. The sliding shelving assembly 101 can include a movable member 66, a sliding shelving stationary member 15, a guide track 96, a guide track extension 97 and a retraction member 57. The movable member 66 can be configured as a sliding member 95, rather than a pivoting member as described above. The sliding member 95 can engage the sliding shelving stationary member 15 with a guide track 96. The guide track 96 can allow the sliding member 95 to move forward generally horizontally from the sliding stationary member 15 from a retracted position (not shown) where the rear face 81 of the sliding member 95 is near a rear portion 100 of the sliding shelving stationary member 15 to a loading position 47 where the front face 42 has extended away from the sliding shelving stationary member 15. The guide tracks 96 can include roller bearings or means known to those skilled in the art to provide smooth movement of the sliding member 95. The guide tracks can include extension tracks 97 that can provide additional movement distance of the sliding member 95.

A retraction member 57 can be included to provide for automatic retraction of the sliding member 95 and can be configured as an extension spring 56 that can be attached to the sliding member 95 on one end and to the frame 20 or sliding shelving stationary member 15 on the other end. The retraction member 57 can be in the form of an elastomeric device such as a rubber band, a hydraulic actuator, a compressed air actuator or an electric motor. The movement of the sliding member, either extending or retracting or both can be motorized. The sliding shelving assembly 101 described above with a sliding member 95 can include a linear damper 104 that can change the speed of the sliding member 95 movement.

In any of the shelving assemblies 40, gravity shelving assembly 90, or sliding shelving assembly 101, described above such as in FIG. 3, 7, 8, 9, 10, or 11, the shelving assemblies 40, gravity shelving assembly 90, or sliding shelving assembly 101 can include a delay timer 105 that can delay activation of any retraction member 57 or retraction device that is included. The delay timer 105 can be mechanical or electronic and can take the form of a securing member such as a latch or detent that can hold the movable member in a loading position 47 for a period of time. The delay time can be settable and adjustable. After the delay time, the movable member 66 can be allowed to retract to a retracted position 45. In another example, a manually or automatically securing member such as a detent or latch can be actuated to hold the movable member 66 in the loading position 47 until the securing member is released manually or automatically. The delay timer 105 can be located in any position in the cabinet 10, such as in the compartment 25 (see FIG. 1) or in the cabinet interior (see FIG. 2). An auto-retract feature for the movable member 66, whether in a pivoting configuration or sliding configuration, can be provided by various mechanisms. These mechanisms may be mounted at the bottom or back of each movable member 66, or in some configurations, a single mechanism may provide an auto-retract function for all the shelving assemblies. The auto-retract mechanisms can be located anywhere inside the cabinet.

The above Detailed Description includes references to the accompanying drawings, which form a part of the Detailed Description. The drawings show, by way of illustration, specific embodiments in which the present insert press and method can be practiced. These embodiments are also referred to herein as "examples."

The above Detailed Description is intended to be illustrative, and not restrictive. For example, the above-described examples (or one or more elements thereof) can be used in combination with each other. Other embodiments can be used, such as by one of ordinary skill in the art upon reviewing the above description. Also, various features or elements can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

In this document, the terms "a" or "an" are used to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "about" and "approximately" are used to refer to an amount that is nearly, almost, or in the vicinity of being equal to a stated amount. In this document, the term "patient" is intended to include mammals, such as for human applications or veterinary applications.

In the appended claims, the terms "including" and "in which" are used as the plain-English equivalents of the respective terms "comprising" and "wherein." Also, in the following claims, the terms "including" and "comprising" are open-ended, that is, an assembly, system, or method that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract is provided to allow the reader to quickly ascertain the nature of the technical disclosure. It is submitted with the understanding that it will not be used to interpret or limit the scope or meaning of the claims.

What is claimed is:

1. A cabinet for storing a plurality electronic devices, the cabinet comprising:
   a frame;
   a power supply system for charging the plurality of devices; and
   a plurality of shelving assemblies, each shelving assembly including:
      a stationary member engaged to the frame, the stationary member having a forward portion;
      a damper assembly coupled to the stationary member, wherein the damper assembly includes a gear;
      a pivoting member engaged to the stationary member, the pivoting member adapted to hold at least one electronic device, the pivoting member including a front face;
      a pivot axis proximate the front face and the forward portion, wherein the pivoting member is configured to pivot about the pivot axis; and
      an arcuate gear track coupled to the pivoting member and engaging the gear.

2. The cabinet of claim 1, wherein the pivoting member has a retracted position and a loading position.

3. The cabinet of claim 1, wherein the pivoting member is adapted to hold a plurality of electronic devices.

4. The cabinet of claim 1, wherein at least one of the plurality of the shelving assemblies includes a retraction member connected to the pivoting member.

5. The cabinet of claim 4, wherein the retraction member, is configured to retract the at least one shelving assembly without user intervention.

6. The cabinet of claim 4, wherein the retraction member is connected to the pivoting member at one of a rear portion of the pivoting member or a front portion of the pivoting member.

7. The cabinet of claim 1, wherein the damper assembly further comprises a delay timer configured to delay a retraction of the pivoting member.

8. The cabinet of claim 1, further comprising a display.

9. The cabinet of claim 1, further comprising a connection to a network.

10. The cabinet of claim 9, wherein the network connection includes a wireless connection.

11. The cabinet of claim 1, further comprising a docking station disposed in the pivoting member.

12. The cabinet of claim 1, wherein the frame defines a front compartment that is configured to house at least one component of the power supply system.

13. An apparatus for storing at least one electronic article, the apparatus comprising:
   a frame;
   a power supply system for charging the at least one electronic article;
   a network connection configured to connect the at least one electronic article to a network;
   a stationary member connected to the frame, the stationary member having a forward portion;
   a pivoting member connected to the stationary member, the pivoting member adapted to hold the at least one electronic article, the pivoting member including a front face; wherein the pivoting member is configured to pivot about a pivot axis proximate the front face and the forward portion;
   a retraction member engaged to the pivoting member, wherein the retraction member includes a spring; and
   a damper assembly engaged with at least one of the pivoting member and the stationary member, wherein the damper assembly includes a damper and a damper gear track; wherein the pivoting member has a retracted position and a loading position, and wherein the retracted position is a substantially vertical position and the loading position is an angled position.

14. The apparatus of claim 13, wherein the angle of the angled position is substantially between 15 and 65 degrees.

15. An apparatus for storing a plurality of electronic articles, the apparatus comprising:
   means for charging the plurality of electronic articles,
   an enclosure having a plurality of storage shelves, each shelf including a stationary member having a forward portion, and a pivoting member engaged to the stationary member, the pivoting member including a front face, the pivoting member configured to move from a retracted position to a loading position and defining at least one space to store at least one electronic article, wherein the pivoting member is configured to pivot about a pivot axis proximate the front face and the forward portion;
   each shelf including a damper assembly engaged with at least one of the pivoting member and stationary member, wherein the damper assembly includes a damper gear and an arcuate gear track; and
   means for automatically retracting the pivoting member to a retracted position.

16. The apparatus of claim 15, wherein the means for retraction includes a retraction member connected to the pivoting member.

* * * * *

UNITED STATES PATENT AND TRADEMARK OFFICE
CERTIFICATE OF CORRECTION

PATENT NO. : 9,665,135 B2  
APPLICATION NO. : 14/224758  
DATED : May 30, 2017  
INVENTOR(S) : Wong et al.

Page 1 of 1

It is certified that error appears in the above-identified patent and that said Letters Patent is hereby corrected as shown below:

In Column 7, Line 13, delete "refracted" and insert --retracted-- therefor

In Column 10, Line 3, delete "refracted" and insert --retracted-- therefor

In Column 10, Line 14, delete "43." and insert --41.-- therefor

In Column 11, Line 9, delete "refracted" and insert --retracted-- therefor

In Column 11, Line 32, delete "86." and insert --87.-- therefor

In Column 11, Line 38, delete "refraction" and insert --retraction-- therefor

In Column 13, Line 23, in Claim 1, after "plurality", insert --of--

In Column 14, Line 23, in Claim 13, delete "face;" and insert --face,-- therefor In Column 14, Line 40, in Claim 15, delete "articles," and insert --articles;-- therefor In Column 14, Line 52, in Claim 15, before "stationary", insert --the--

Signed and Sealed this  
Eighth Day of May, 2018

Andrei Iancu  
*Director of the United States Patent and Trademark Office*